United States Patent [19]
Wasimoto et al.

[11] Patent Number: 5,069,640
[45] Date of Patent: Dec. 3, 1991

[54] MINIATURE BULB ASSEMBLY AND METHOD OF PRODUCING THE SAME

[75] Inventors: Takasi Wasimoto, Yokohama; Morio Kimura, Fukushima, both of Japan

[73] Assignees: Stanley Electric Co., Ltd.; Alpine Electronics Inc., Japan

[21] Appl. No.: 573,538

[22] Filed: Aug. 27, 1990

[30] Foreign Application Priority Data

Aug. 29, 1989 [JP] Japan ................... 1-222578

[51] Int. Cl.$^5$ ............................................. H01K 1/00
[52] U.S. Cl. .................................... 439/619; 439/736
[58] Field of Search ............... 439/611, 612, 613, 614, 439/617, 619, 650, 651, 602, 605, 236, 242, 243, 244, 736, 699, 736, 56, 547, 554; 313/313, 315, 318

[56] References Cited

U.S. PATENT DOCUMENTS

| 4,114,972 | 9/1978 | Kraus et al. .................... 439/699 X |
| 4,303,297 | 12/1981 | Smart et al. .................... 439/375 X |
| 4,791,335 | 12/1988 | Lin ................................. 439/318 |
| 4,837,927 | 6/1989 | Savage, Jr. ..................... 439/56 X |

FOREIGN PATENT DOCUMENTS 2749446 5/1979 Fed. Rep. of Germany ........ 439/56

*Primary Examiner*—Larry I. Schwartz
*Assistant Examiner*—Julie R. Daulton
*Attorney, Agent, or Firm*—Louis Weinstein

[57] ABSTRACT

A miniature bulb assembly adapted to be mounted on a base board includes a socketless miniature bulb, a base portion molded of synthetic resin and a pair of terminal members. The miniature bulb is received in a bulb receiving hole at the central part of the base portion while a pair of lead wires extending from the miniature bulb are inserted through lead wire holes on the bottom wall of the base portion. Each terminal member comprises an elongated plate-shaped terminal and a base fitting portion, both of which are integrated with the base portion during a molding operation. The lead wires are connected to tongue-shaped pieces projecting from lead wire connection tabs in a clamped state. The base portion may be formed with T-shaped terminal insert holes on the opposite sides thereof such that terminal members each having a disengagement preventive tapered portion are tightly inserted thereinto from the above. Alternatively, the base portion may be formed with rectangular terminal insert holes on the opposite sides such that terminal members each having a fixed pawl are inserted thereinto from the bottom side of the base portion.

22 Claims, 6 Drawing Sheets

MINIATURE BULB ASSEMBLY AND METHOD OF PRODUCING THE SAME

BACKGROUND OF THE INVENTION

1. Field of the Invention

The present invention relates generally to a miniature bulb assembly adapted to be mounted on a base board. More particularly, the present invention relates to a miniature bulb assembly which assures that a plurality of miniature bulb assemblies can simultaneously be mounted on a printed base board during, e.g., a solder reflowing step in the same manner as resistors, capacitors or the like circuit components. Further, the present invention relates to a method of successively producing a number of miniature bulb assemblies of the foregoing type.

2. Description of the Related Art

FIG. 10 is a perspective view which shows by way of example a conventional miniature bulb assembly 100 adapted to be mounted on a base board 110, particularly illustrating a state before a socketless miniature bulb 102 is received in a bulb receiving hole in the form of a cylindrical cavity.

The miniature bulb assembly 100 includes a base portion 101 molded of synthetic resin in a cylindrical configuration, and the base portion 101 has a flange at the bottom part thereof. A pair of lead wires 102a extending from the miniature bulb 102 are inserted through lead wire holes 101b on a bottom wall 101a of the base portion 101 so that they are projected downward of the bottom wall 101a of the base portion 101 to serve as mounting terminals.

However, with the conventional miniature bulb assembly 100 as constructed in the above-described manner, since the lead wires 102a extending from the miniature bulb 102 serve also as terminals for mounting the miniature bulb assembly 100 on the base board 110, it has been found that there arise problems with the lead wires 102a. For example, in view of gastightness to be maintained during a sealing step, practical use of the lead wires 102a is restricted particularly in respect of dimensions and material to be employed therefor. Other problems are that the lead wires 102a have shortage in strength when they are used as mounting terminals and moreover they have a degraded property of soldering.

In recent years, there is a tendency that a solder reflowing process is usually employed for a step of automatically assembling circuit components on the base board 110. In addition, an excellent capability of provisionally mounting circuit components on the base board 110 has been required in conjunction with the assembling operation. However, as long as the lead wires 102a serve also as mounting terminals in the above-described manner, it is difficult to meet the requirement for assuring an excellent capability of firmly mounting circuit components. Therefore, there often occurs a malfunction that the miniature bulb 102 is undesirably floated up after completion of a soldering operation.

Since a pair of lead wire holes 101b determine a pitch for mounting the miniature bulb 102, an inner diameter of each lead wire hole 101b can not unavoidably be dimensioned to largely differ from an outer diameter of each lead wire 102a. Therefore, a high skillfulness is required for carrying out a step of allowing the lead wires 102a to be inserted through the lead wire holes 101b during an operation of assembling the miniature bulb 102 with the result that productivity is degraded.

SUMMARY OF THE INVENTION

The present invention has been made with the foregoing background in mind.

An object of the present invention is to provide a miniature bulb assembly adapted to be mounted on a base board wherein the aforementioned problems inherent to the conventional miniature bulb assembly are entirely eliminated.

Another object of the present invention is to provide a method of successively producing a number of miniature bulb assemblies of the foregoing type.

To accomplish the above objects, there is provided according to one aspect of the present invention a miniature bulb assembly adapted to be mounted on a base board, wherein the miniature bulb assembly comprises a socketless miniature bulb having a pair of lead wires extending therefrom, a base portion molded of synthetic resin having an electrical insulating property, the base portion being formed with a bulb receiving hole in the form of a circular cavity at the substantially central part, a pair of lead wire holes on the bottom wall and a pair of terminal grooves on the opposite sides thereof, the bulb receiving hole receiving the miniature bulb in an upright standing state at the time of an assembling operation which is performed with the lead wires inserted through the lead wire holes, and a pair of terminal members made of metallic material, each of the terminal members comprising an elongated plate-shaped terminal and a base fitting portion, a small part of the elongated plate-shaped terminal and a large part of the base fitting portion being integrated with the base portion during a molding operation, the elongated plate-shaped terminal being bent downwardly at a position near to the upper surface of the base portion to extend in the terminal groove so that its foremost end is fitted to the base board, the base fitting portion having a lead wire connection tab projecting to the outside therefrom so as to allow one lead wire to be connected to the wire connection tab in a clamped state by folding a tongue-shaped piece projecting outward of the lead wire connection tab.

In addition, according to other aspect of the present invention, there is provided a miniature bulb assembly adapted to be mounted on a base board, wherein the miniature bulb assembly comprises a socketless miniature bulb having a pair of lead wires extending therefrom, a base portion molded of synthetic resin having an electrical insulating property, the base portion being formed with a bulb receiving hole in the form of a circular cavity at the substantially central part, a pair of lead wire holes on the bottom wall and a pair of T-shaped terminal grooves on the opposite sides thereof, the bulb receiving hole receiving the miniature bulb in an upright standing state at the time of an assembling operation which is performed with the lead wires inserted through the lead wire holes, each of the T-shaped terminal grooves having an opening portion exposed to the outside so as to allow one lead wire to enter the T-shaped terminal groove, and a pair of plate-shaped terminal members made of metallic material, each of the plate-shaped terminal members comprising an insert portion, an elongated plate-shaped terminal, a lead wire connection tab bent at a right angle relative to the insert portion so as to allow one lead wire to be connected thereto by welding or the like process and a disengagement preventive tapered portion projecting from the insert portion, the insert portion being tightly inserted into the T-shaped insert groove with the elongated plate-shaped terminal projecting downward of the base portion to be fitted to the base board, the disengagement preventive tapered portion being engaged with the bottom wall of the base portion to prevent the terminal member from being disengaged from the base portion.

Further, according to another aspect of the present invention, there is provided a miniature bulb assembly adapted to be mounted on a base board, wherein the miniature bulb assembly comprises a socketless miniature bulb having a pair of lead wires extending therefrom, a base portion molded of synthetic resin having an electrical insulating property, the base portion being formed with a bulb receiving hole in the form of a circular cavity on the bottom wall, a pair of wire holes on the bottom wall and a pair of rectangular terminal insert holes on the opposite sides thereof, the bulb receiving hole receiving the miniature bulb in an upright standing state at the time of an assembling operation which is performed with the lead wires inserted through the lead wire holes, and a pair of terminal members made of metallic material, each of the terminal member comprising an elongated plate-shaped terminal and a fixing pawl formed by cutting out a part of the elongated plate-shaped terminal at the upper end of the latter, the elongated plate-shaped terminal being inserted into the terminal insert hole from the bottom side of the base portion, the fixing pawl projecting inwardly by its own resiliency at the time of an inserting operation of the elongated plate-shaped terminal so as to allow the elongated plate-shaped terminal to be fixedly engaged with a stepped portion in the form of a groove in the terminal insert hole, the stepped portion being located correspondingto the fixing pawl.

The socketless miniature bulb may be received in the bulb receiving hole in the form of an elliptic cavity in a laid state.

It is preferable that the base portion is formed with a bottom groove on the bottom surface thereof in order to assure that the pair of lead wires extend into the bottom groove without an occurrence of interference with lead wires extending on adjacent other miniature bulb assembly.

Each lead wire may be connected directly to the lead wire connection tab by welding or the like process. In this case, the tongue-shaped pieces are not required.

Alternatively, each lead wire may be connected directly to the elongated plate-shaped terminal by welding or the like process. In this case, the lead wire connection tabs are not required.

To improve a capability of provisionally mounting the miniature bulb assembly on the base board for the purpose of preventing an occurrence of malfunctions such as disengagement, floating-up of the miniature bulb assembly or the like during a soldering operation to be performed later, it is preferable that each elongated plate-shaped terminal has a V-shaped bent part at a position below the bottom surface of the base portion, wherein the V-shaped bent part serves as provisional mounting means.

Further, to improve an operational efficiency of mounting the miniature bulb on the base board, it is preferable that each elongated plate-shaped terminal has a L-shaped bent part at the lowermost end thereof so that it is fixedly mounted on the base board via the L-shaped bent part by soldering, welding or the like process.

Additionally, according to still another aspect of the present invention, there is provided a method of successively producing a number of miniature bulb assemblies each constructed according to the one aspect of the present invention, wherein the method comprises the steps of successively performing a punching operation for a band-shaped metallic material in the form of a hoop or a strip by operating a transfer press or the like machine between adjacent bridges each extending between opposite sides of the band-shaped metallic material to form of a pair of terminal members in a spaced relationship in the hollow space formed by the punching operation between the adjacent bridges, each of the terminal members comprising an elongated plate-shaped terminal and a base fitting portion, placing the pair of terminal members on a molding machine, molding a base portion with synthetic resin with the pair of terminal members integrated with the base portion by an insert molding process or the like process, cutting the pair of terminal members from the band-shaped metallic material at outer ends thereof, bending elongated plate-shaped terminals downwardly bending tongue-shaped pieces of lead wire connection tabs upwardly, and receiving a socketless miniature bulb in a bulb receiving hole with a pair of lead wires inserted through a pair of lead wire holes.

Other objects, features and advantages of the present invention will become readily apparent from reading of the following description which has been made in conjunction with the accompanying drawings.

BRIEF DESCRIPTION OF THE DRAWINGS

The present invention is illustrated in the following drawings in which:

FIG. 8 and FIG. 9 show steps of successively producing a number of miniature bulb assemblies each adapted to be mounted on a base board in accordance with the present invention, respectively, wherein FIG. 8 is a plan view of a band-shaped material which has been subjected to a punching operation to form a pair of elongated plate-shaped terminals in a spaced relationship and FIG. 9 is a plan view illustrating that the elongated plate-shaped terminals are integrated with a base portion by a molding operation.

DESCRIPTION OF THE PREFERRED EMBODIMENTS

Now, the present invention will be described in detail hereinafter with reference to the accompanying drawings which illustrate several preferred embodiments thereof.

Figure 1:
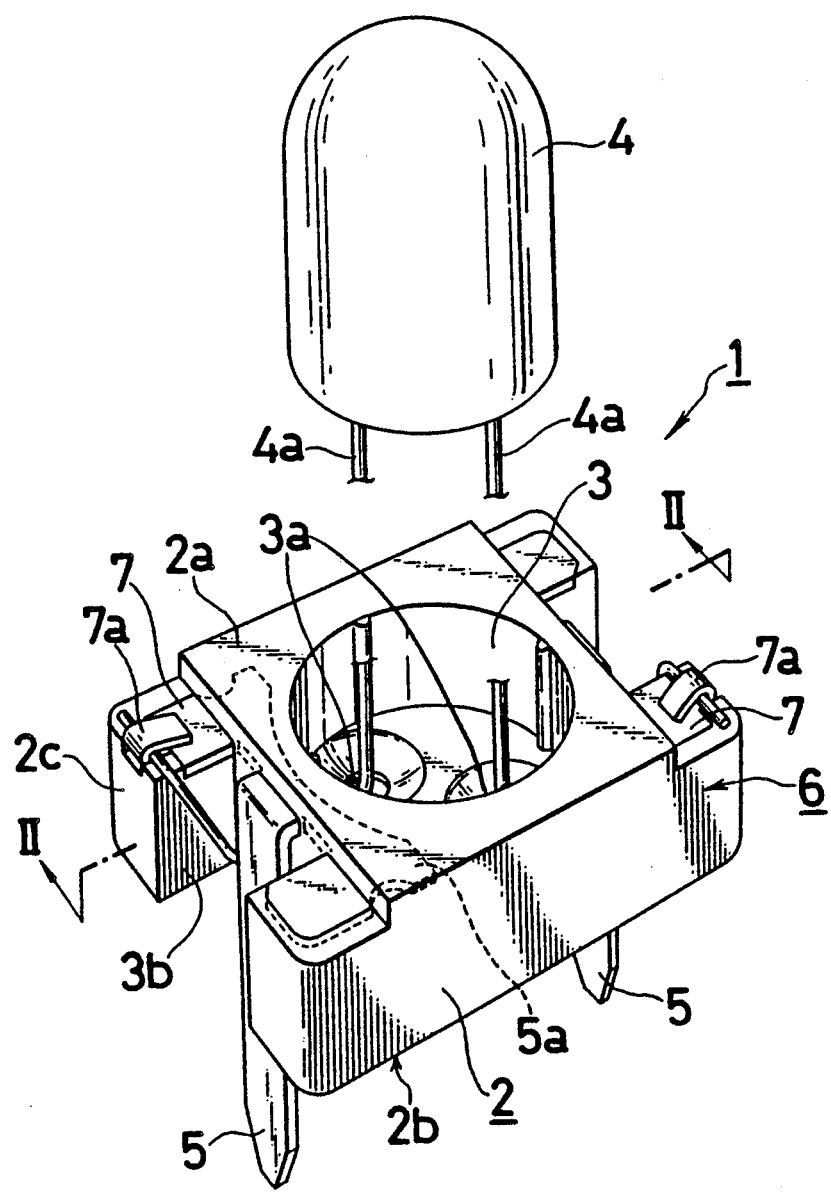
FIG. 1 is a perspective view of a miniature bulb assembly adapted to be mounted on a base plate in accordance with a first embodiment of the present invention, particularly illustrating a state before a socketless miniature bulb is received in an upright standing state in a bulb receiving hole in the form of a circular cavity.
Figure 2:
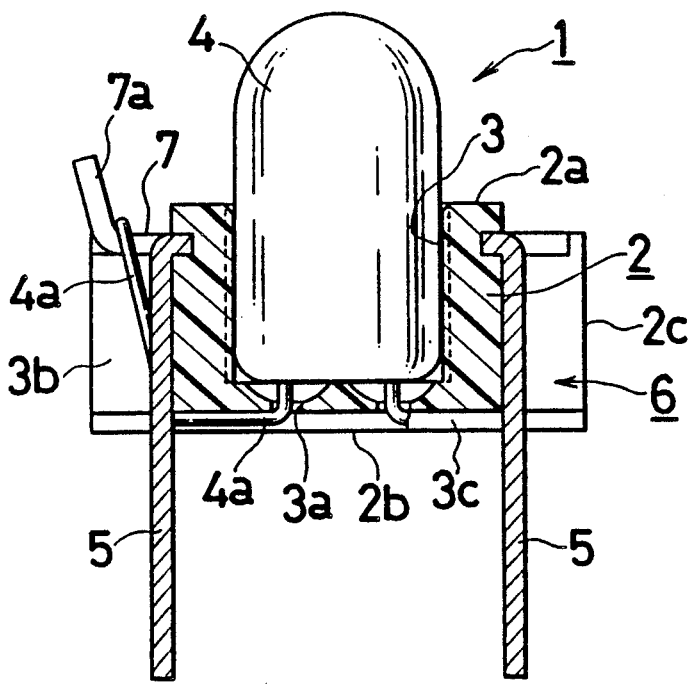
FIG. 2 is a sectional view of the miniature bulb assembly taken along line II — II in FIG. 1.

FIG. 1 and FIG. 2 illustrate a miniature bulb assembly adapted to be mounted on a base board (hereinafter referred to simply as a miniature bulb assembly) in accordance with a first embodiment of the present invention, respectively. The miniature bulb assembly is generally identified by reference numeral 1 in the drawings.

Figure 10:
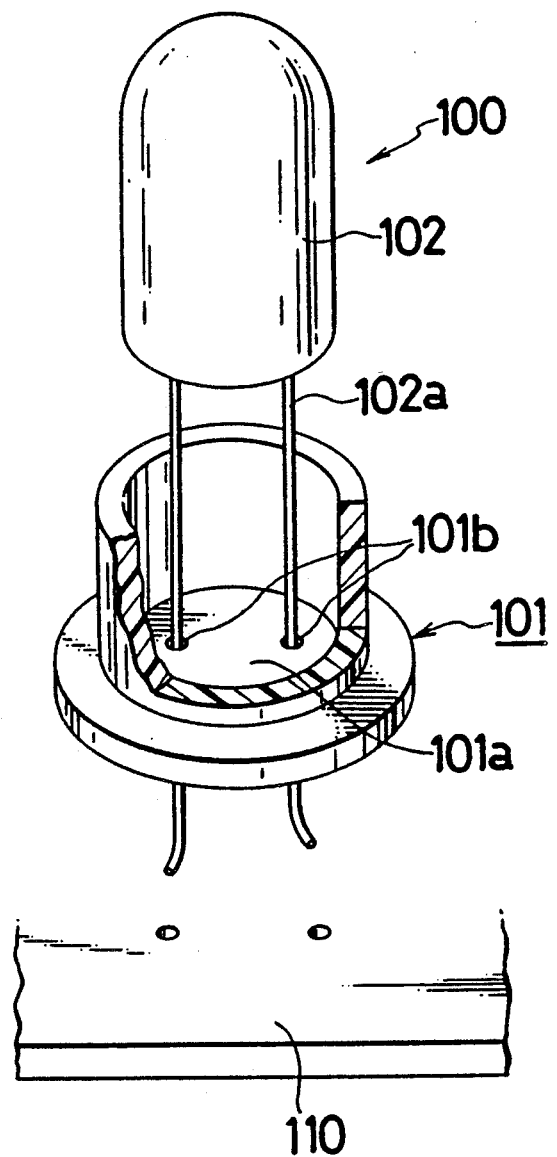
FIG. 10 is a perspective view of a conventional miniature bulb assembly adapted to be mounted on a base board, particularly illustrating a state before a socketless miniature bulb is received in a bulb receiving cavity.

The miniature bulb assembly 1 includes a base portion 2 molded of synthetic resin, and the base portion 2 is formed with a bulb receiving hole 3 in the form of a circular cavity and two lead wire holes 3a so that a socketless miniature bulb 4 is received in the bulb receiving hole 3 in the same manner as a conventional miniature bulb assembly which has been described above with reference to FIG. 10.

In contrast with the conventional miniature bulb assembly, according to the present invention, two lead wires 4a extending from the miniature bulb 4 do not serve also as terminals for the miniature bulb assembly 1 on a printed base board 110. As is best seen in FIG. 2 which is a sectional view of the miniature bulb assembly 1 taken along line II — II in FIG. 1, the base portion 2 is provided with a pair of elongated plate-shaped terminals 5 so as to enable the miniature bulb 4 to be mounted on the printed base board 110 with the aid of the elongated plate-shaped terminals 5.

Next, the base portion 2 and the elongated plate-shaped terminals 5 will be described in more details in the following.

As is apparent from FIG. 1, the base portion 2 is molded of synthetic resin in a parallelepiped configuration so that the bulb receiving hole 3 having a bottom wall 2b is formed at the substantially central part thereof downward of an upper surface 2a of the base portion 2. In addition, a pair of lead wire holes 3a are formed through the bottom wall 2b of the bulb receiving hole 3.

As is well known, in recent years, there is a tendency that a large number of electronic components are integrally arranged on the printed base board 110 at a very high density. For this reason, it is highly anticipated that wire extension is carried out between the pair of elongated plate-shaped terminals 5. To prevent a short-circuit from taking place between adjacent lead wires, it is preferable that a bottom groove 3c is formed on the bottom wall 2b while extending from the lead wire holes 3a to terminal grooves 3b to be described later.

The pair of elongated plate-shaped terminals 5 made of metallic material are integrated with the base portion 2 on opposite side surfaces 2c of the base portion 2 relative to the bulb receiving hole 3 at positions near to the upper surface 2a of the base portion 2 by an insert molding process or the like process to provide a so-called socket assembly 6.

Each elongated plate-shaped terminal 5 includes a base fitting portion 5a as represented by dotted lines in FIG. 1. The base fitting portions 5a are protruded inward of the side surfaces 2c of the base portion 2 in order to increase a capability of firmly holding the elongated plate-shaped terminals 5 when the latter are integrated with the base portion 2 to constitute the socket assembly 6.

In addition, lead wire connection tabs 7 are projected from opposite ends of the base fitting portion 5a in substantial parallel with the elongated plate-shaped terminal 5. It should be noted that the lead wire connection tabs 7 are embedded in the base portion 2 during the integral insert molding process in such a manner that a large part of each of the elongated plate-shaped terminals 5 and a small part of each of the lead wire connection tabs 7 are exposed to the outside at positions in the proximity of the upper surface 2a of the base portion 2.

The terminal groove 3b having a sufficient width extends from the upper surface 2a down to the bottom wall 2b along the side surface 2c of the base portion 2. A large part of the elongated plate-shaped terminal 5 is bent down toward the bottom wall 2b at a right angle relative to the upper surface 2a of the base portion 2 so that the elongate plate-shaped terminal 5 is received in the terminal groove 3b.

When the miniature bulb 4 is to be fitted to the base portion 2 of the socket assembly 6 including the elongated plate-shaped terminals 5 and the lead wire connection tabs 7 in an integrally molded structure, the lead wires 4a are first inserted through the lead wire insert holes 3a and the miniature bulb 4 is then received in the hole 3. Thereafter, each lead wire 4a extends further via the bottom groove 3c and the terminal groove 3b to the lead wire connection tab 7. Then, the foremost end of the lead wire 4a is fixedly connected to the lead wire connecting tab 7 in a clamped state by folding a tongue-shaped piece 7a projecting outward of the lead wire connecting tab 7. For the purpose of improving electrical connectability, the lead wire 4a may be connected directly to the lead wire connection tab 7 by welding or the like process, as required.

Alternatively, the lead wire 4a may be connected directly to the elongated plate-shaped terminal 5 by spot welding or the like process at a location where n interference takes place with the printed base board 110. In this case, the lead wire connection tab 7 of course is not required.

Figure 3:
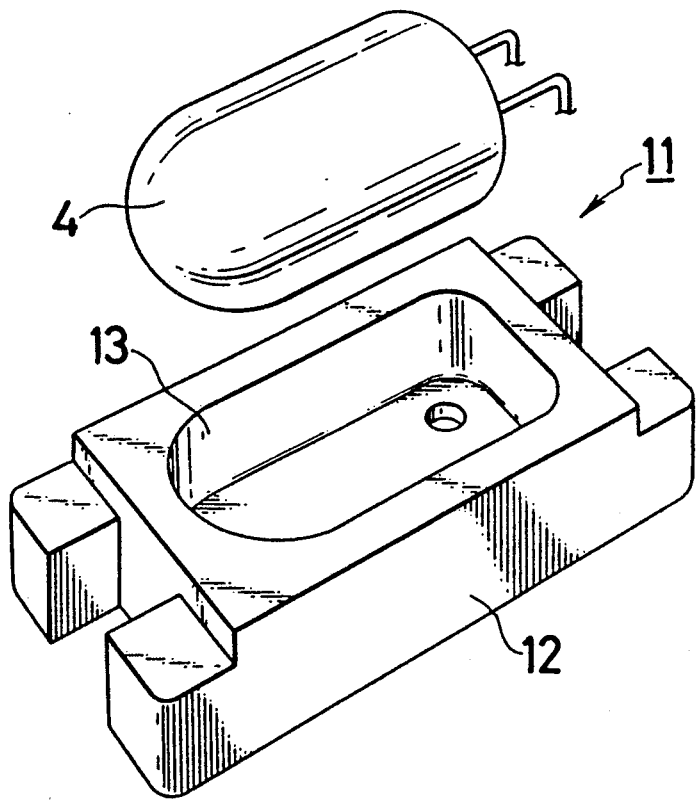
FIG. 3 is a schematic perspective view of a miniature bulb assembly adapted to be mounted on a base board in accordance with a second embodiment of the present invention, particularly illustrating a state before a socketless miniature bulb is received in a laid state in a bulb receiving hole in the form of an elliptical-shaped cavity.

FIG. 3 is a perspective view which schematically illustrates a miniature bulb assembly in accordance with a second embodiment of the present invention wherein the miniature bulb assembly is generally identified by reference numeral 11. In this embodiment, the miniature bulb assembly 11 is mounted on a base portion 12 in a laid state for the reason of increasing a lighting effect given by the socketless miniature bulb 4. To this end, a bulb receiving hole 13 in the form of an elliptic cavity is configured corresponding to the laid state of the miniature bulb 4.

Since the remaining structure of the FIG. 3 embodiment is entirely the same as that in the preceding embodiment, repeated description will not be required.

Figure 4:
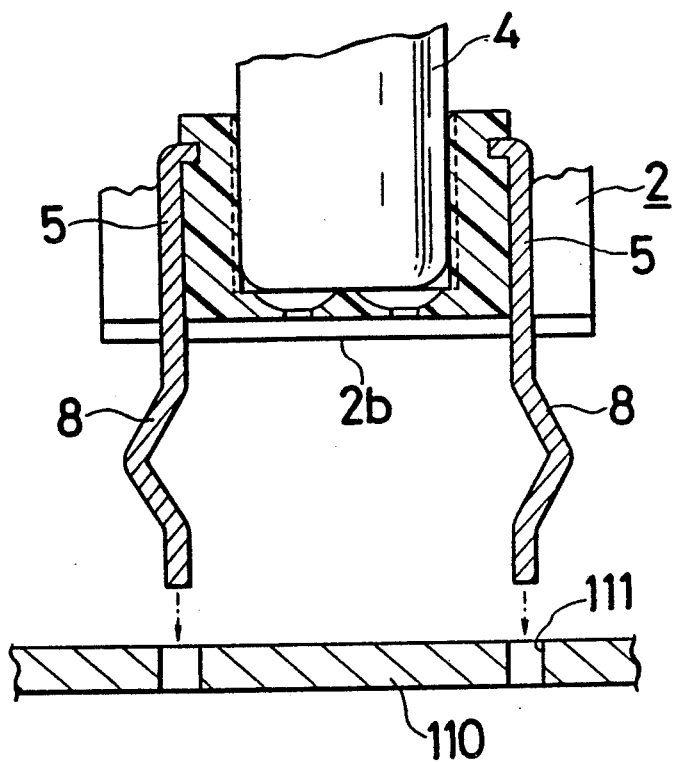
FIG. 4 is a fragmentary sectional view of a miniature bulb assembly adapted to be mounted on a base board in accordance with a third embodiment of the present invention, particularly illustrating a state before a pair of elongated plate-shaped terminals each having a V-shaped bent part are fitted in holes on the base board.

FIG. 4 is a fragmentary sectional view of a miniature bulb assembly in accordance with a third embodiment of the present invention, particularly illustrating an essential part of the miniature bulb assembly on the lower side of the latter. In addition, FIG. 5 is a fragmentary sectional view of a miniature bulb assembly in accordance with a fourth embodiment of the present invention, particularly illustrating an essential part of the miniature bulb assembly on the lower side of the latter.

In contrast with the miniature bulb assembly 1 in the first embodiment of the present invention as shown in FIG. 1 wherein the elongated plate-shaped terminals 5 extend linearly, according to the third embodiment of the present invention shown in FIG. 4, a part of each of the elongated plate-shaped terminals 5 projecting downward of the bottom wall 2b is bent to provide V-shaped bent portions 8 in a symmetrical relationship relative to each other wherein the V-shaped bent portions 8 serve as provisional mounting means. With such arrangement of the V-shaped bent portions 8 in this way, a capability of provisionally mounting the miniature bulb assembly 1 when lower ends of the V-shaped bent portions 8 are inserted in fitting holes 111 on the printed base plate 110 can be improved. Thus, any malfunction such as disengagement, floating-up of the miniature bulb assembly 1 or the like does not occur even when a stress appears during an automatic soldering step to be performed later in a soldering bath or the like means.

Figure 5:
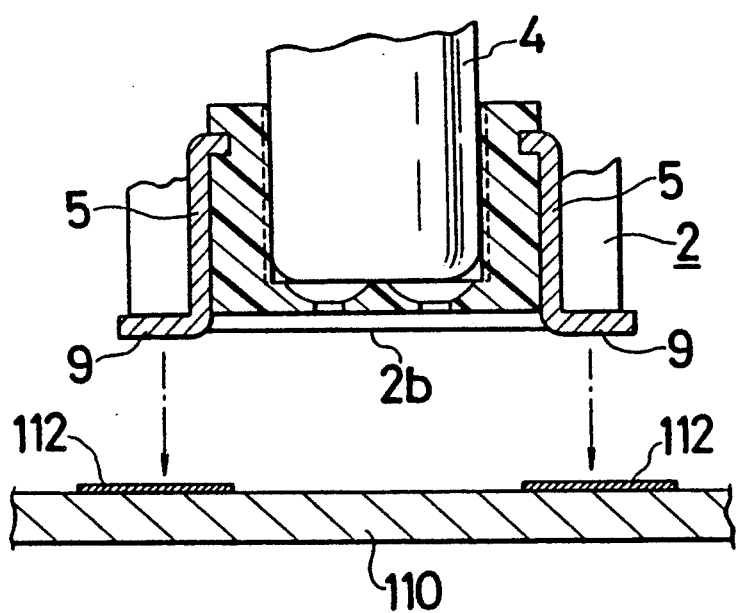
FIG. 5 is a fragmentary sectional view of a miniature bulb assembly adapted to be mounted on a base board in accordance with a fourth embodiment of the present invention, particularly illustrating a state before a pair of elongated plate-shaped terminals are fixedly placed on the base board via L-shaped bent parts.

According to the fourth embodiment of the present invention shown in FIG. 5, a lower end portion of each elongated plate-shaped terminal 5 is bent at a right angle to extend in parallel with the bottom wall 2b thereby to provide a contact portion 9. Arrangement of these contact portions 9 in this way makes it possible to mount the miniature bulb assembly, without necessity for forming the fitting holes 111 on the printed base board 110, in the same manner as so-called chip components such as resistors, capacitors or the like components available in a commercial market. In addition, the arrangement of the contact portions 9 makes it possible to effectively assemble the printed base board without necessity for an inserting operation.

While the third embodiment and the fourth embodiment have been described with reference to the first embodiment, it goes without saying that the third embodiment and the fourth embodiment are equally applicable to the second embodiment.

Figure 6:
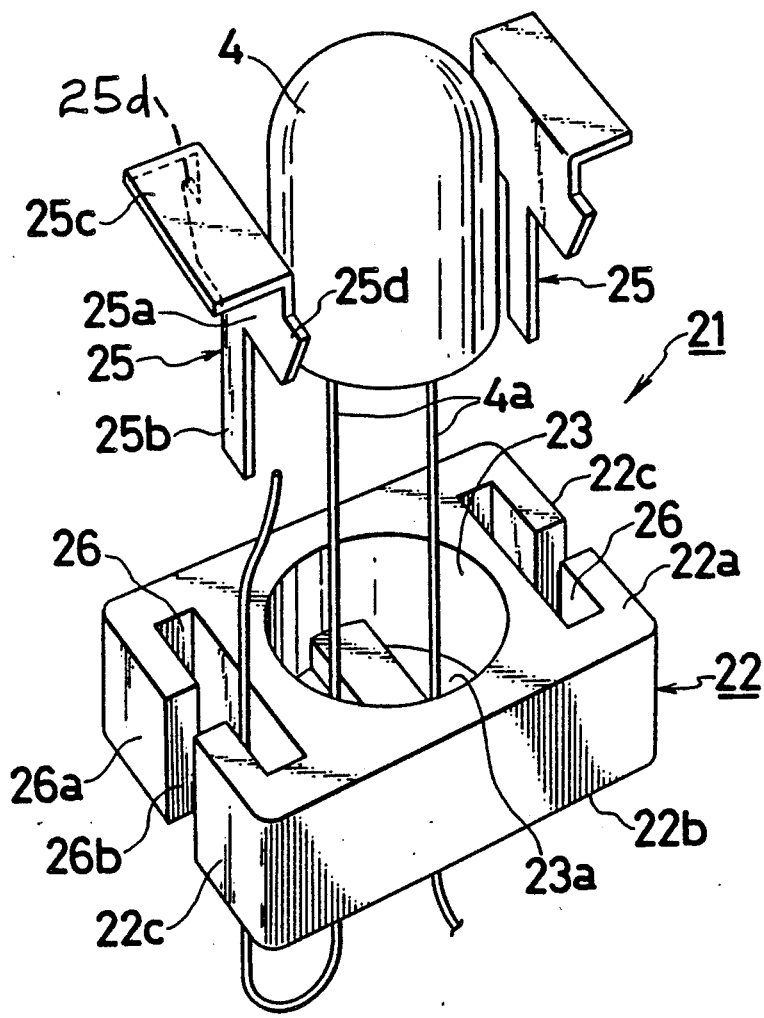
FIG. 6 is a perspective view of a miniature bulb assembly adapted to be mounted on a base board in accordance with a fifth embodiment of the present invention, particularly illustrating a state before a socketless miniature bulb is received in a bulb receiving hole and a pair of plate-shaped terminals are tightly inserted into T-shaped terminal insert holes.

FIG. 6 is a perspective view which illustrates a miniature bulb assembly in accordance with a fifth embodiment of the present invention in a disassembled state wherein the miniature bulb assembly is generally identified by reference numeral 21 in the drawing. Practical structure of the miniature bulb assembly 21 is substantially same to that in the first embodiment of the present invention with the exception that a base portion 22 and a pair of plate-shaped terminal members 25 are assembled together after they are separately fabricated as individual components.

The base portion 22 for the miniature bulb assembly 22 is molded of synthetic resin having an electrical insulating property in a parallelepiped configuration. A bulb receiving hole 23 having a specific depth so as not to reach a bottom surface 22b of the base portion 22 is formed downward of the substantially central part of an upper surface 22a of the base portion 22. Additionally, a pair of lead wire holes 23a (not shown) are formed on the bottom wall of the base portion 22 between the bottom surface of the bulb receiving hole 23 and the bottom surface 22b of the base portion 22 so as to allow a pair of lead wires 4a to be inserted through the lead wire holes 23a.

T-shaped terminal insert holes 26 each having a length equal to a full thickness of the base portion 22 are formed on the opposite sides of the bulb receiving hole 23 at a predetermined pitch based on, e.g., an inch scale set for the printed base board. The base portion 22 includes L-shaped foot portions 26a on the opposite ends thereof while defining the T-shaped insert holes 26. The inner end of each foot portion 26a extends along a side surface 22c of the base portion 22 to reach an opening portion 26b thereby to define the latter in cooperation with the inner end of the opposite foot portion 26a.

The plate-shaped terminal member 25 is composed of an insert portion 25a made of electrical conductive metallic material to be tightly fitted in the T-shaped terminal insert hole 26 and an elongated plate-shaped terminal 25b. The insert portion 25a has a lead wire connection tab 25c at the top end thereof which is bent outwardly at a substantially right angle relative to the insert portion 25a. In addition, the insert portion 25a has a disengagement preventive tapered portion 25d at a suitable location as shown in the drawing.

Since a socketless miniature bulb 4 is entirely the same as a conventional one, a detailed description will not be required.

The miniature bulb assembly 21 including the base portion 22, the plate-shaped terminal members 25 and the socketless miniature bulb 4 as essential components is assembled in the following manner.

While a pair of lead wires 4a are inserted through the lead wire holes 23a, the socketless miniature bulb 4 is received in the bulb receiving hole 23 of the base portion 22. Thereafter, the lead wires 4a are folded from the bottom surface 22b side toward the upper surface 22a side of the base portion 22 to enter the T-shaped terminal insert holes 26 via the opening portions 26b.

After completion of the folding operation of the lead wires 4a, the plate-shaped terminal members 25 are force-fitted into the T-shaped terminal insert holes 26 while the lead wire connection tabs 25c are each oriented toward the adjacent side surface 22c.

Since the insert portion 25a of the plate-shaped terminal member 25 has the disengagement preventive tapered portion 25d, the plate-shaped terminal member 25 is immovably held by force-fitting the insert portion 25a into the T-shaped terminal insert hole 26. At this time, the elongated plate-shaped terminal 25b is projected downwardly and below the bottom surface 22b of the base portion 22.

Since each lead wire 4a is fully inserted through the T-shaped terminal insert hole 26 at this time, electrical connection of the plate-shaped terminal member 25 to the socketless miniature bulb 4 is accomplished by connecting each lead wire 4a to the plate-shaped terminal member 25 at a certain position on the lead wire connection tab 25c by spot welding or the like process. It should be added that the opening portion 26c serves also as an insert port so as to allow a welding rod to reach a specific welding spot.

Although illustration and description are eliminated for the purpose of simplification, it goes without saying that the fifth embodiment may be equally applicable to a case where the socketless miniature bulb 4 is mounted in accordance with the second embodiment shown in FIG. 3.

Figure 7:
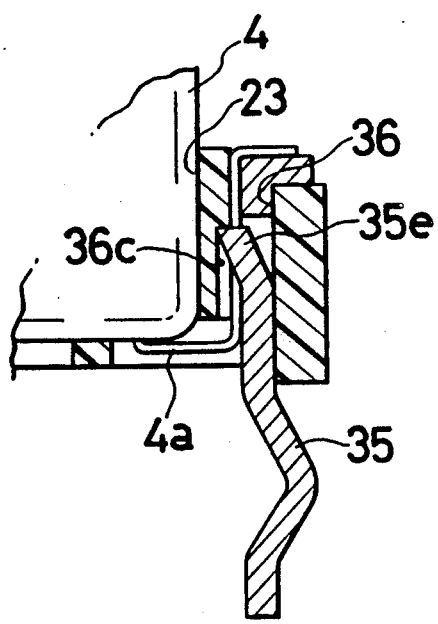
FIG. 7 is a fragmentary sectional view of a miniature bulb assembly in accordance with a sixth embodiment of the present invention, particularly illustrating that an elongated plate-shaped terminal is inserted into a terminal insert hole with a fixing pawl formed at the upper end thereof.

FIG. 7 is a fragmentary sectional view which illustrates an essential part of a miniature bulb assembly in accordance with a sixth embodiment of the present invention. A characterizing feature of the sixth embodiment consists in that a capability of fitting an elongated plate-shaped terminal 35 in a rectangular terminal insert hole 36 as well as an efficiency of performing an assembling operation are improved further. In detail, the elongated plate-shaped terminal 35 is made of metallic material having excellent resiliency such as brass, phosphor bronze or the like metallic material, and a fixing pawl 35e adapted to project by its own resiliency effective in the opposite direction to that of inserting the elongated plate-shaped terminal 35 is formed at the upper end part of the elongated plate-shaped terminal 35 by cutting out a part of the elongated plate-shaped terminal 35, while a stepped portion 36c in the form of a groove is formed on the inner wall of the terminal insert hole 36 in a region corresponding to the fixing pawl 35e.

Formation of the fixing pawl 35e and the stepped portion 36c in the above-described manner assures that the elongated plate-shaped terminal 35 becomes immovable in the both forward/backward directions when the fixing pawl 35e expands inwardly by its own spring force after the elongated plate-shaped terminal 35 is inserted into the terminal insert hole 36 while the fixing pawl 35e is compressed and the foremost end of the elongated plate-shaped terminal 35 reaches the stepped portion 36c. It is obvious that more reliable and tight fitting of the elongated plate-shaped terminal 35 in the terminal insert hole 36 is assured in comparison with the preceding embodiment wherein the disengagement preventive tapered portion 25d serves as fixing means.

Although illustration and description are eliminated also in this embodiment for the purpose of simplification, either formation of provisional mounting means as shown in FIG. 4 or formation of contact portions as shown in FIG. 5 may additionally be applied to the fifth embodiment and the sixth embodiment of the present invention.

Next, a method of successively producing a number of miniature bulb assemblies will be described below with reference to FIG. 8 and FIG. 9.

Figure 8:
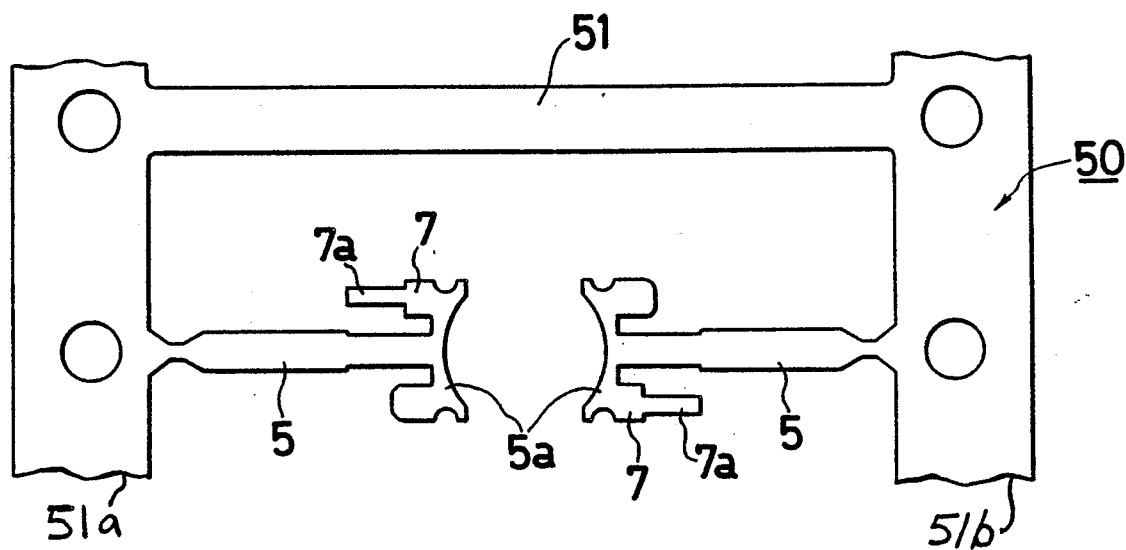
Figure 9:
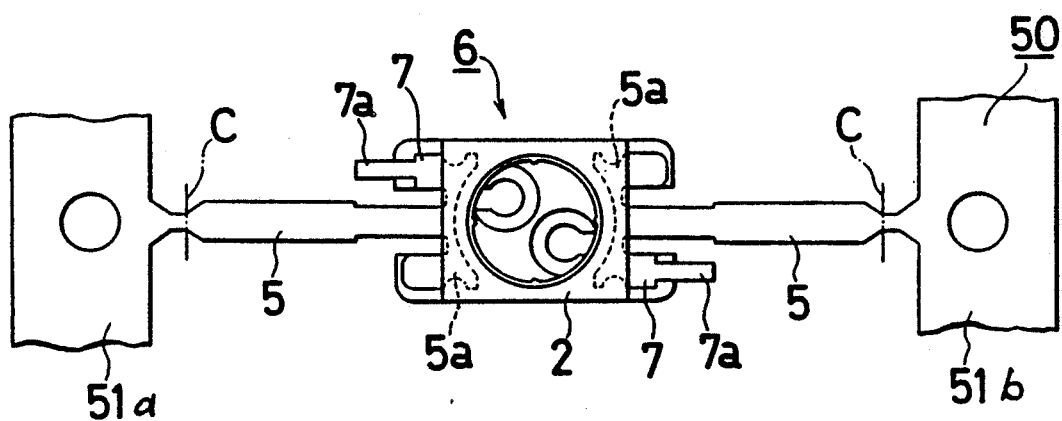

First, a band-shaped material 50 in the form of a hoop or a strip is subjected to a punching operation by operating a transfer press or the like machine (not shown) to form a pair of plate-shaped terminal members in a spaced relationship, as shown in FIG. 8. The bridges 51 and marginal side portions 51a, 51b form a ladder-like configuration, each pair of terminal members 5, 5 being supported by a pair of bridges 51 and side portions 51a, 51b.

Here, the band-shaped material 50 will be described in more detail in the following.

A number of bridges 51 are successively formed on the band-shaped material 50 at a predetermined pitch. The pair of plate-shaped terminal members each comprising an elongated plate-shaped terminal 5, a base fitting portion 5a and a lead wire connection tab 7 are oppositely formed in a spaced relationship between the adjacent bridges 51 while the outer end of each elongated plate-shaped terminal 5 is connected to the band-shaped material 50.

Since configuration and function of the elongated plate-shaped terminals 5, the base fitting portions 5a and the lead wire connection tabs 7 have been already described above with reference to the first embodiment of the present invention, repeated description will not be required.

Subsequently, the band-shaped material 50 press worked in the above-described manner is placed on a resin molding machine (not shown) so that a base portion 2 is molded of synthetic resin in an integral structure with the base fitting portions 5a inserted therein as represented by dotted lines in FIG. 9.

Since the elongated plate-shaped terminals 5, the base fitting portions 5a and the lead wire connection tabs 7 are arranged in an equally spaced relationship in the longitudinal direction of the band-shaped material 50 at a predetermined pitch, it is possible to simultaneously mold a plurality of base portions 2 with synthetic resin. Alternatively, molding operations may be performed via a series of continuous steps in such a manner as to mold a single base portion 2 by each molding operation.

The base portion 2 has been integrated with the elongated plate-shaped terminals 5 and the lead wire connection tabs 7 via the aforementioned molding step, as mentioned above. Next, as shown in FIG. 9, a cutting operation is performed at positions represented by reference characters C in the drawing to separate the integral structure from the band-shaped material 50. On completion of the cutting operation, the elongated plate-shaped terminals 5 are bent downwardly and tongue-shaped pieces 7a of the lead wire connection tabs 7 are bent upwardly. Thereafter, a socketless bulb 4 is received in a miniature bulb receiving hole 3 while a pair of lead wires 4a are connected to the lead wire connection tabs 7 either in a clamped state by a folding operation of the tongue-shaped pieces 7a or by welding or the like process.

As will be apparent from the above description, according to a first aspect of the present invention, there is provided a miniature bulb assembly adapted to be mounted on a base board wherein a socketless miniature bulb is immovably received in the bulb receiving hole of a base portion while a pair of elongated plate-shaped terminals integrated with the base portion are fixedly fitted to the base plate in an integral structure by an assembling operation or by a soldering operation. Consequently, the miniature bulb assembly of the present invention offers a advantageous effect that it can be mounted on a printed base board with remarkably improved dimensional accuracy and mechanical strength. By virtue of an improved strength of the elongated plate-shaped terminals, other advantageous effects are that a capability of provisionally mounting a miniature bulb assembly during a soldering operation which is performed in, e.g., a soldering bath can be improved and moreover a quality of the printed base board after completion of the assembling operation can be improved.

As described above, since the elongated plate-shaped terminals are designed exclusively for the mounting operation, other advantageous effects are that no dimensional accuracy is required for allowing a pair of lead wires to be drawn from a socketless miniature bulb and fixed to terminal members and moreover no particular step of causing each lead wire to extend through a very fine lead wire hole with a complicated operation and skillfulness is required, resulting in highly increased productivity being assured.

In addition, since a pair of elongated plate-shaped terminals are integrated with the base portion, it becomes sufficiently possible to automatically mount a number of miniature bulb assemblies by operating, e.g., an automatic mounting machine. Thus, productivity can be improved further by automating the mounting step.

According to a second aspect of the present invention, there is provided a method of successively producing a number of miniature bulb assemblies each adapted to be mounted on a base board wherein an opposing pair of elongated plate-shaped terminals are successively formed on a band-shaped material at a predetermined pitch by a punching operation and each pair of elongated plate-shaped terminals are integrated with a base portion by an insert molding process. Therefore, the method of the present invention offers an advantageous feature that a step of assembling and mounting the miniature bulb assembly can be automated, resulting in substantially improved productivity being assured.

While the present invention has been described above with respect to several preferred embodiments thereof, it should of course be understood that the present invention should not be limited only to them but various changes or modifications may be made without departure of the scope of the invention as defined by the appended claims.

What is claimed is:

1. A miniature bulb assembly adapted to be mounted on a base board, said miniature bulb assembly comprising:
    a socketless miniature bulb having a pair of lead wires extending therefrom,
    a base member molded of synthetic resin having an electrical insulating property, said base member being formed with a bulb receiving recess in the form of a cavity at the substantially central part of the base member, a pair of lead wire holes in the bottom of the recess and a pair of terminal grooves on the opposite sides of said recess, said bulb receiving recess receiving said miniature bulb at the time of an assembling operation which is performed with said lead wires inserted through said lead wire holes so as to project away from said base member, and
    a pair of terminal members made of conductive material, each of said terminal members comprising an elongated plate-shaped terminal and a base fitting portion, a first part of said elongated plate-shaped terminal and a part of said base fitting portion being embedded in said base member during a molding operation, a second part of said elongated plate-shaped terminal extending away from the base member being bent to extend into an associated terminal groove so that a free end of said elongated plate-shaped terminal extends below said base member for mounting to said base board, said lead wires each being connected to an associated one of said terminal members.

2. The miniature bulb assembly as claimed in claim 1, wherein the socketless miniature bulb has a longitudinal axis and is received in a bulb receiving hole in the form of an elliptic cavity having a longitudinal axis, said bulb longitudinal axis being substantially parallel to the longitudinal axis of the elliptical cavity.

3. The miniature bulb assembly as claimed in claim 1, wherein the base member has a bottom surface which is provided with bottom grooves each extending between one of said lead wire holes and one of said terminal grooves, said lead wires each being arranged to one of said bottom grooves to protect said lead wires.

4. The miniature bulb assembly as claimed in claim 1, wherein each elongated plate-shaped terminal has a V-shaped bent portion at a position inwardly from the free end thereof, said V-shaped bent portion at least partially extending into the base board openings.

5. The miniature bulb assembly as claimed in claim 1, wherein each lead wire is connected directly to a lead wire connection tab by welding or a like process.

6. The miniature bulb assembly as claimed in claim 1, wherein each lead wire is connected directly to the elongated plate-shaped terminal by welding or the like process.

7. The miniature bulb assembly as claimed in claim 1, wherein each elongated plate-shaped terminal has an L-shaped bent portion at the free end thereof to enable a side surface of the bent portion to directly engage the base board.

8. The miniature bulb assembly as claimed in claim 7, wherein said bent portion is fixedly mounted on the base board by soldering, welding or a like process.

9. A miniature bulb assembly adapted to be mounted on a base board, said miniature bulb assembly comprising:
    a socketless miniature bulb having a pair of lead wires extending therefrom,
    a base member molded of synthetic resin having an electrical insulating property, said base member having upper and lower surfaces and two pairs of opposing sidewalls and being formed with a bulb receiving recess in the form of an annular cavity arranged at the substantially central portion of the base member upper surface, a pair of lead wire holes in the bottom of said cavity extending to said lower surface of said base member, and a pair of T-shaped terminal grooves arranged in said base member on opposite sides of said central opening, said bulb receiving hole receiving said miniature bulb in an upright standing position at the time of an assembling operation which is performed with said lead wires inserted through said lead wire holes, each of said T-shaped terminal grooves having an opening portion communicating with an associated one of said first pair of opposing sidewalls to facilitate insertion of an associated lead wire into the T-shaped terminal groove, and
    a pair of plate-shaped terminal members made of conductive material, each of said plate-shaped terminal members comprising an insert portion, an elongated plate-shaped terminal portion, a lead wire connection tab bent at a right angle relative to said insert portion so as to allow one lead wire to be connected thereto by welding at a like process and a disengagement preventive tapered portion projecting from said insert portion, each of said insert portions being force-fitted into an associated T-shaped insert groove together with said disengagement preventive portion, said elongated plate-shaped terminal projecting downwardly from said base member for coupling with said base board, said disengagement preventive tapered portion intimately engaging its associated T-shaped groove to prevent a terminal member from being disengaged from the base member.

10. The miniature bulb assembly as claimed in claim 9, wherein the socketless miniature bulb has a longitudinal axis and is received in a bulb receiving hole in the form of an elliptic cavity having a longitudinal axis, said bulb longitudinal axis being substantially parallel to the longitudinal axis of the elliptical cavity.

11. The miniature bulb assembly as claimed in claim 9, wherein each elongated plate-shaped terminal has a V-shaped bent portion at a position inwardly from the free ends thereof, said V-shaped bent portion at least partially extending into an associated opening in the base board.

12. The miniature bulb assembly as claimed in claim 9, wherein each lead wire is connected to the elongated plate-shaped terminal by welding or a like process.

13. The miniature bulb assembly as claimed in claim 9, wherein the base member bottom surface is provided with bottom grooves each extending from one of said lead wire holes to an associated T-shaped groove, each of said lead wires being arranged in one of said grooves to protect said lead wires.

14. The miniature bulb assembly as claimed in claim 13, wherein the depths of said bottom grooves are greater than the thickness of said lead wires.

15. The miniature bulb assembly as claimed in claim 9, wherein each elongated plate-shaped terminal has an L-shaped bent portion at the free end thereof to enable a side surface on the bent portion to directly engage the base board.

16. The miniature bulb assembly as claimed in claim 15, wherein said L-shaped bent portion is fixed to the base board by soldering, welding or a like process.

17. A miniature bulb assembly adapted to be mounted upon a base board, said miniature bulb assembly comprising:
a socketless miniature bulb having a pair of lead wires extending therefrom,
a base member molded of a synthetic resin having an electrical insulating property, said base member having upper and lower surface and two pairs of opposing sidewalls and being formed with a bulb receiving recess in the form of an annular cavity arranged at substantially the central portion of and extending downwardly from said upper surface, a pair of lead wire holes arranged in the bottom of said cavity and extending to said lower surface, and a pair of rectangle terminal insert holes arranged on opposite sides of said recess, said bulb receiving recess receiving said miniature bulb in an upright standing position at the time of an assembling operation which is performed with said lead wires inserted through said lead wire holes, and
a pair of conductive terminal members, each of said terminal members comprising an elongated planar plate-shaped terminal portion having an integral fixing pawl formed by cutting out a portion of the elongated plate-shaped terminal and bending said pawl so that a portion thereof extends away from the plane of said plate-shaped terminal portion, each pawl being forced toward alignment with the plane of said plate-shaped member as it is being inserted into a terminal insert hole in said base portion,
each terminal insert hole having a stepped portion, said fixing pawl being snap-fitted into said stepped portion as it becomes aligned with said stepped portion.

18. The miniature bulb assembly as claimed in claim 17, wherein the socketless miniature bulb has a longitudinal axis and is received in a bulb receiving hole in the form of an elliptic cavity having a longitudinal axis, said bulb longitudinal axis being substantially parallel to the longitudinal axis of the elliptical cavity.

19. The miniature bulb assembly as claimed in claim 17, wherein the base member has a bottom surface which is provided with bottom grooves each extending between one of said lead wire holes and one of said terminal grooves, said lead wires each being arranged in one of said bottom grooves to protect said lead wires.

20. The miniature bulb assembly as claimed in claim 17, wherein each elongated plate-shaped terminal has a V-shaped bent portion at a position inwardly from the free end thereof, said V-shaped bent portion at least partially extending into a opening in the base board.

21. The miniature bulb assembly as claimed in claim 17, wherein each elongated plate-shaped terminal has an L-shaped bent portion at the free end thereof to enable a side surface of the bent portion to directly engage the base board.

22. The miniature bulb assembly as claimed in claim 17, wherein each lead wire is connected to the elongated plate-shaped terminal by welding or a like process.

* * * * *

UNITED STATES PATENT AND TRADEMARK OFFICE
CERTIFICATE OF CORRECTION

PATENT NO. : 5,069,640

DATED : December 3, 1991

INVENTOR(S) : Wasimoto et al.

It is certified that error appears in the above-identified patent and that said Letters Patent is hereby corrected as shown below:

Column 12, line 9, change "to" to --in--

Column 12, line 62, change "at" to --or--

Column 13, line 4, change "a" to --the--

Signed and Sealed this

Sixteenth Day of March, 1993

*Attest:*

STEPHEN G. KUNIN

*Attesting Officer*     *Acting Commissioner of Patents and Trademarks*